(12) United States Patent
Li et al.

(10) Patent No.: US 7,864,536 B2
(45) Date of Patent: Jan. 4, 2011

(54) CIRCUIT BOARD ASSEMBLY

(75) Inventors: Qin Li, Shenzhen (CN); Yu-Hsu Lin, San Jose, CA (US); Jeng-Da Wu, Taipei Hsien (TW); Chih-Hang Chao, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 9 days.

(21) Appl. No.: 12/464,560

(22) Filed: May 12, 2009

(65) Prior Publication Data

US 2010/0165579 A1 Jul. 1, 2010

(30) Foreign Application Priority Data

Dec. 31, 2008 (CN) .................. 2008 2 0303946

(51) Int. Cl.
H05K 7/20 (2006.01)
H01L 23/36 (2006.01)

(52) U.S. Cl. .............. 361/719; 361/703; 361/704; 361/715; 165/80.3; 165/104.33; 174/16.3; 174/252

(58) Field of Classification Search ............ 361/679.46, 361/704, 707, 709, 712, 715, 719, 720, 725–728, 361/732, 737, 747, 752–756, 758, 759; 257/706–727; 174/15.1, 16.1, 16.3, 252; 165/80.2, 80.3, 165/80.4, 80.5, 104.33, 104.34, 121–126, 165/185; 24/473, 625, 457, 458

See application file for complete search history.

(56) References Cited

U.S. PATENT DOCUMENTS

| 6,055,159 | A * | 4/2000 | Sun .............................. 361/704 |
| 6,384,331 | B1 * | 5/2002 | Ku ............................... 174/548 |
| 6,424,527 | B1 * | 7/2002 | Bailey et al. ............. 361/679.46 |
| 6,480,388 | B1 | 11/2002 | Lee et al. |
| 6,538,893 | B1 * | 3/2003 | Hsu ............................ 361/719 |
| 6,542,366 | B2 * | 4/2003 | Davis et al. .................. 361/703 |
| 6,611,431 | B1 * | 8/2003 | Lee et al. ..................... 361/719 |
| 7,019,979 | B2 * | 3/2006 | Wang et al. .................. 361/719 |
| 7,142,427 | B2 * | 11/2006 | Reents ......................... 361/704 |
| 7,224,587 | B2 * | 5/2007 | Dittus et al. ................. 361/719 |
| 7,283,364 | B2 * | 10/2007 | Refai-Ahmed et al. ....... 361/719 |
| 7,283,368 | B2 * | 10/2007 | Wung et al. .................. 361/719 |
| 7,292,447 | B2 * | 11/2007 | Xia et al. ..................... 361/719 |
| 7,336,496 | B1 * | 2/2008 | Hsu ............................ 361/719 |
| 7,443,682 | B2 * | 10/2008 | Fan et al. ..................... 361/709 |
| 7,580,262 | B2 * | 8/2009 | Chou et al. .................. 361/700 |
| 7,609,525 | B2 * | 10/2009 | Fan et al. ..................... 361/752 |
| 7,626,822 | B2 * | 12/2009 | Ma et al. ..................... 361/719 |
| 7,667,970 | B2 * | 2/2010 | Ma et al. ..................... 361/704 |

* cited by examiner

*Primary Examiner*—Michael V Datskovskiy
(74) *Attorney, Agent, or Firm*—D. Austin Bonderer

(57) ABSTRACT

A circuit board assembly includes a circuit board with two heat dissipating assemblies mounted thereon and an L-shaped back plate attached to an underside of the circuit board. Each of the heat dissipating assembly includes at least a pair of securing members at opposite corners thereof. The back plate includes a first portion and a second portion each defining at least a pair of circular protrusions corresponding to the securing members of the heat dissipating assemblies.

13 Claims, 2 Drawing Sheets

CIRCUIT BOARD ASSEMBLY

BACKGROUND

1. Technical Field

The present disclosure relates to circuit board assembly, and particularly relates to a circuit board assembly with a back plate for reinforcing the circuit board.

2. Description of Related Art

A conventional printed circuit board assembly (PCBA) includes a circuit board, a plurality of electronic components mounted on the circuit board, and a plurality of tin balls attached on the circuit board for electrically connecting the electronic components to the circuit board. However, if an electronic component, such as a CPU chip with a heat sink mounted thereon, endures much stress, the circuit board may be deformed and the tin balls may be broken, causing opens in the electrical connections.

Therefore, there is room for improvement in the art.

DETAILED DESCRIPTION

Figure 1:
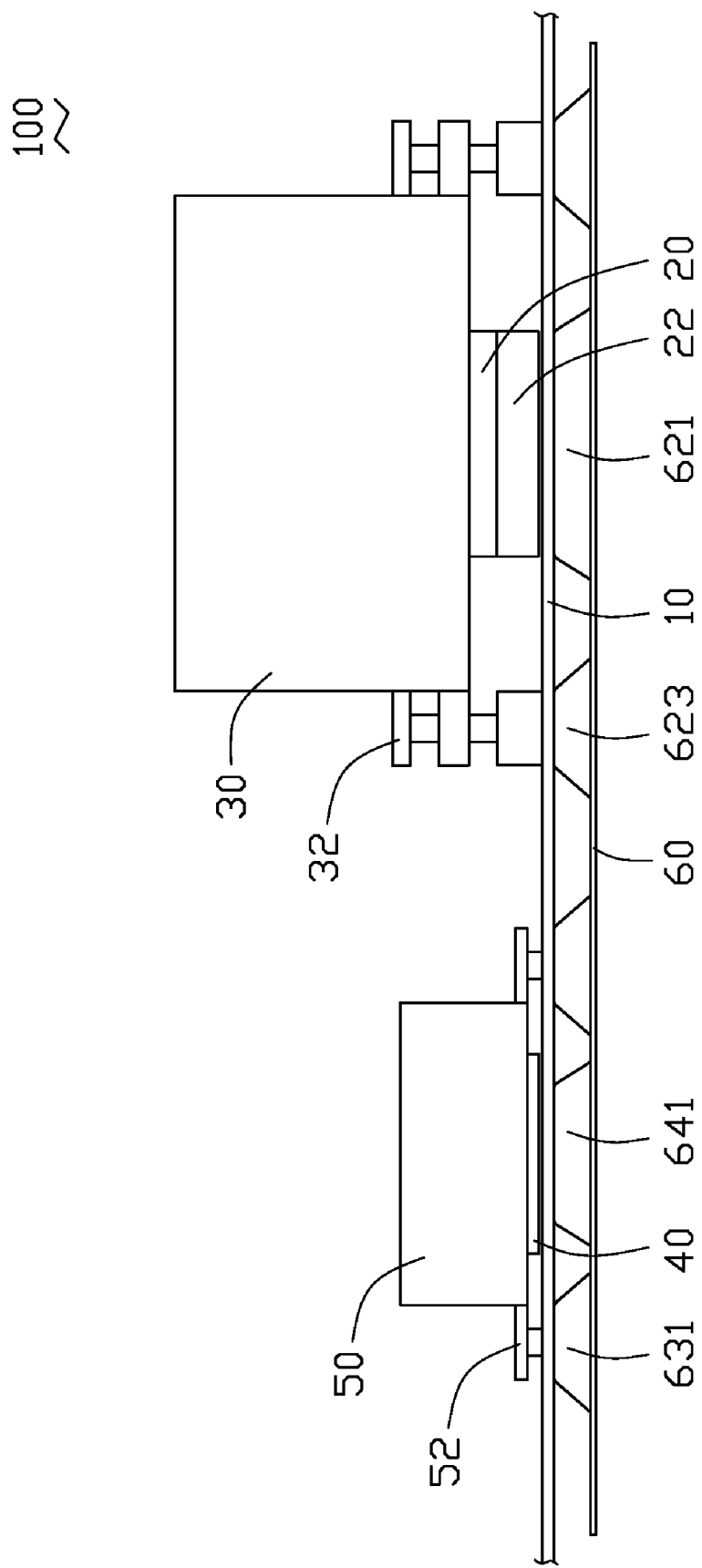
FIG. 1 an assembled view of a circuit board assembly in accordance with an embodiment of the present disclosure.
Figure 2:
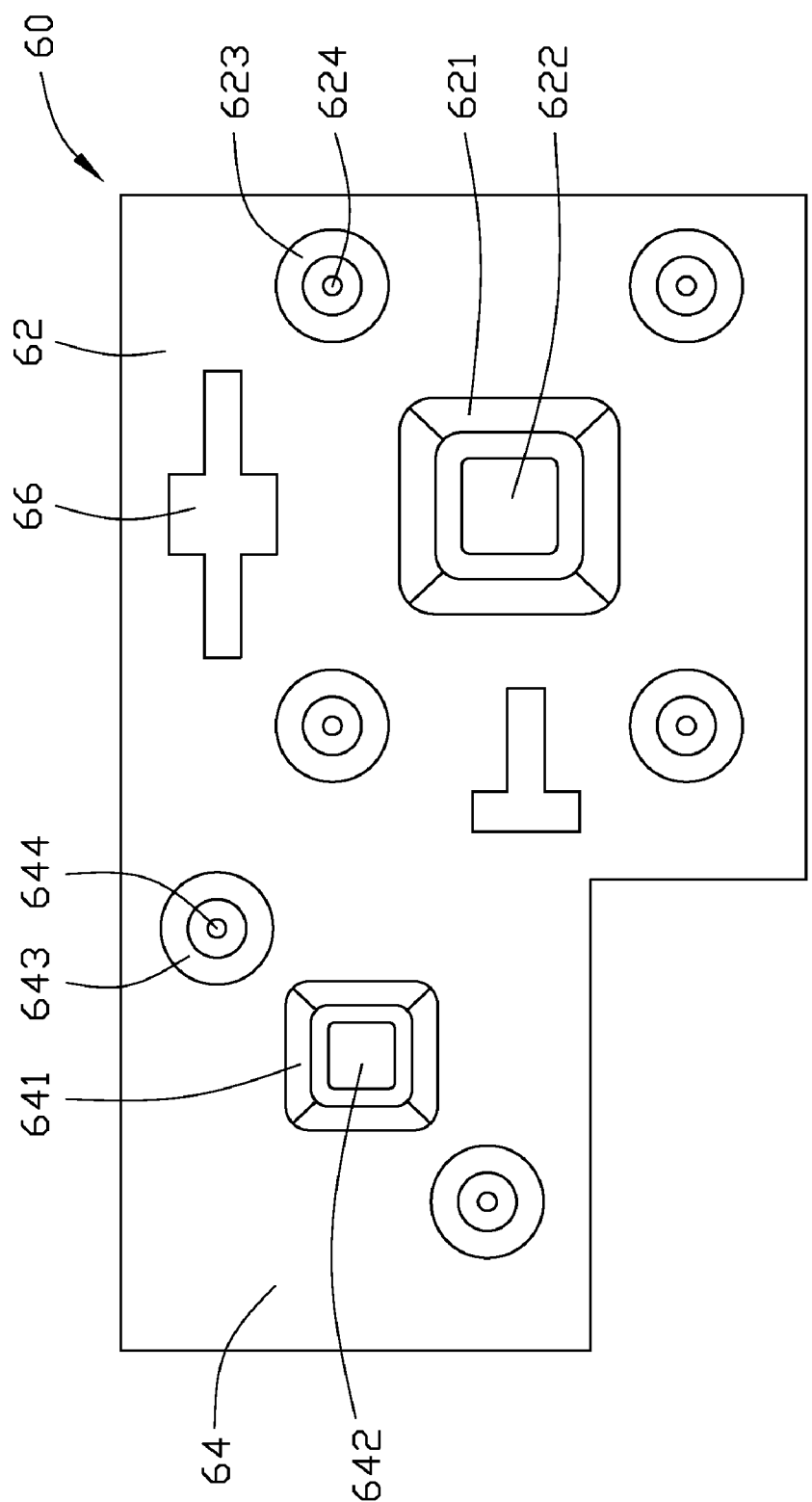
FIG. 2 is another view of the back plate of FIG. 1.

Referring to FIGS. 1 and 2, a circuit board assembly 100 in accordance with an embodiment includes a circuit board 10, a first heat generating component 20 attached to the circuit board 10, and a second heat generating component 40 mounted on the circuit board 10. A first heat dissipating assembly 30 is attached on the first heat generating component 20 for dissipating heat from the first heat generating component 20. A second heat dissipating assembly 50 is attached on the second heat generating component 40 for dissipating heat from the second heat generating component 40. An integrally molded back plate 60 is attached to an underside of the circuit board 10 for reinforcing the circuit board 10. In this embodiment, the circuit board 10 is a motherboard; the first heat generating component 20 is a CPU chip 20 mounted on the motherboard via a CPU socket 22; the second heat generating component 40 is a Northbridge chip 40 mounted on the motherboard 10.

The first heat dissipating assembly 30 includes a securing member 32 at each of four corners thereof for securing the heat assembly 30 on the circuit board 10. The second heat dissipating assembly 50 includes a securing member 52 at each of two opposite corners thereof.

The back plate 60 is L-shaped and includes a first portion 62 below the first heat generating component 20 and a second portion 64 below the second heat generating component 40. The first portion 62 of the back plate 60 includes a first raised stand 621 resisting against the underside of the circuit board 10 below the CPU 20. A quadrate opening 622 is defined in the first raised stand 621 for avoiding unwanted contact between the back plate 60 and the circuit board 10. The first portion 62 of the back plate 60 further includes four circular protrusions 623 each defining a through hole 624 therein corresponding to the securing members 32 of the first heat dissipating assembly 30. A mounting opening 66 is defined in the first portion 62 of the back plate 60 for securing the circuit board assembly in a chassis having a corresponding mounting piece for engaging with the mounting opening 66. In this embodiment the mounting opening 66 is cross-shaped or T-shaped, but can be other shapes in other embodiments.

The second portion 64 of the back plate 60 includes a second raised stand 641 resisting against the underside of the circuit board 10 below the second heat generating component 40 and a pair of circular protrusions 643 each defining a through hole 644 therein corresponding to the securing members 52 of the second heat dissipating assembly 50. A quadrate opening 642 is defined in the second raised stand 641 for avoiding unwanted contact between the back plate 60 and the circuit board 10.

Due to the back plate 60 being attached to the circuit board 10, the circuit board 10 has added support and is not easily deformed by the stress. Thus, tin balls mounted on circuit board 10 for connecting the components 20, 40 are protected from deformation. Electrical connections between the components 20, 40 and the circuit board 10 are reliable.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A circuit board assembly comprising:
    a circuit board;
    a first chip mounted on a topside of circuit board with a first heat dissipating assembly attached thereon;
    a second chip mounted on the topside of circuit board with a second heat dissipating assembly attached thereon;
    a back plate attached to an underside of the circuit board, the back plate comprising a first portion below the first chip and a second portion below the second chip; at least a cross-shaped mounting opening defined in the first portion for securing the circuit board assembly in a chassis.

2. The circuit board assembly of claim 1, wherein the first portion includes a first raised stand abutting the underside of the circuit board below the first chip.

3. The circuit board assembly of claim 2, wherein the second portion of the back plate includes a second raised stand abutting the underside of the circuit board below the second chip.

4. The circuit board assembly of claim 3, wherein the first portion and the second portion are quadrate, the first portion is larger than the second portion.

5. The circuit board assembly of claim 3, wherein each of the first raised stand and the second raised stand defined a quadrate opening therein.

6. The circuit board assembly of claim 1, wherein each of the first heat dissipating assembly and the second heat dissipating assembly comprises at least a pair of securing members; and each of the first portion and the second portion comprises a pair of circular protrusions each having a through hole defined therein corresponding to the securing members.

7. The circuit board assembly of claim 1, wherein the first chip is a CPU chip, and the second chip is a Northbridge chip.

8. A circuit board assembly comprising:
    a circuit board with two heat dissipating assemblies mounted thereon, each of the heat dissipating assembly comprising at least a pair of securing members; and
    an L-shaped back plate attached to an underside of the circuit board, the back plate comprising a first portion and a second portion each defining at least a pair of circular protrusions corresponding to the securing members;
    wherein a plurality of mounting openings are defined in the first portion of the back plate, and the mounting openings are L-shaped or T-shaped.

9. The circuit board assembly of claim 8, further comprising a first heat generating component and a second heat generating component mounted on the circuit board, the first and second heat dissipating assemblies are respectively mounted on the first heat generating component and the second heat generating component.

10. The circuit board assembly of claim 9, wherein the first heat generating component is a CPU chip, and the second heat generating component is a Northbridge chip.

11. The circuit board assembly of claim 10, wherein the first portion is larger than the second portion.

12. The circuit board assembly of claim 9, wherein the first portion comprises a first raised stand that abuts the underside of the circuit board below the first heat generating component; the second portion comprises a second raised stand that abuts the underside of the circuit board below the second heat generating component.

13. The circuit board assembly of claim 8, wherein the circuit board is a motherboard.

* * * * *